United States Patent [19]

Kida

[11] Patent Number: 4,628,263

[45] Date of Patent: Dec. 9, 1986

[54] NUCLEAR MAGNETIC RESONANCE SPECTROMETER

[75] Inventor: Jun Kida, Tokyo, Japan

[73] Assignee: Jeol Ltd., Tokyo, Japan

[21] Appl. No.: 619,005

[22] Filed: Jun. 11, 1984

[30] Foreign Application Priority Data

Jun. 13, 1983 [JP] Japan .............................. 58-105386
Aug. 12, 1983 [JP] Japan .............................. 58-147885

[51] Int. Cl.$^4$ .......................................... G01R 33/20
[52] U.S. Cl. .................................... 324/321; 324/307
[58] Field of Search ............... 324/307, 310, 312, 314, 324/318, 320, 321, 322, 175, 309; 250/231 S E; 356/151

[56] References Cited

U.S. PATENT DOCUMENTS

| | | | |
|---|---|---|---|
| 3,462,677 | 8/1969 | Paitich .................................. | 324/310 |
| 3,593,136 | 7/1971 | Chapman et al. .................... | 324/175 |
| 4,301,410 | 11/1981 | Wind et al. .......................... | 324/307 |
| 4,475,084 | 10/1984 | Moore et al. ........................ | 324/309 |
| 4,516,074 | 5/1985 | Sugimoto ............................. | 324/309 |

Primary Examiner—Stephen A. Kreitman
Assistant Examiner—Scott M. Oldham
Attorney, Agent, or Firm—Webb, Burden, Robinson & Webb

[57] ABSTRACT

A nuclear magnetic resonance spectrometer includes a device for sensing the angular position of the sample tube and a device for adding up the free induction decay signals. The RF pulses are applied to the sample according to the output signal from the sensing device when a certain location of the sample tube is at a first specific position and also when the certain location is at a second position diametrically opposite to the first position. The two free induction decay signals obtained in this way are added up by the adding device to prevent occurrence of peaks, known as spinning sidebands, at positions shifted from the peaks of an NMR spectrum by integral multiples of the rotational frequency of the sample when the axis of rotation of the sample tube does not coincide with the central line of the sample.

5 Claims, 15 Drawing Figures

NUCLEAR MAGNETIC RESONANCE SPECTROMETER

BACKGROUND OF THE INVENTION

The present invention relates to a nuclear magnetic resonance spectrometer and, more particularly, to a nuclear magnetic resonance spectrometer capable of eliminating deleterious effects, such as occurrence of sidebands upon spinning of the sample tube, which result from the eccentricity of the sample tube, asymmetry of the shape of the tube, and other causes.

The resolution of an NMR spectrum depends on the homogeneity of the static, or dc, magnetic field which is applied to the sample in the direction of Z-axis. Therefore, in an ordinary nuclear magnetic resonance spectrometer, the sample tube is rotated about the Z-axis in the static magnetic field to equalize and neutralize the effects resulting from the inhomogeneity of the static field. This technology is known as "spinning." In the following situations, however, peaks, termed spinning sidebands, occur at the positions shifted from the peaks of an NMR spectrum by integral multiples of the rotational frequency of the sample, because the obtained NMR signal is subjected to modulation, and hence a difficulty is introduced in the analysis of the spectrum. (a) Excessively large inhomogeneous components of a static magnetic field which are not symmetrical with respect to the axis of rotation of the sample are left uncancelled. (b) The RF magnetic field (pulses) which is produced during observation is not spacially homogeneous in intensity. (c) The axis of rotation of the sample tube does not coincide with the central axis of the sample because of insufficient accuracy with which the sample tube is fabricated or for other causes. The spinning sidebands attributable to the phenomena (a) and (b) above can be almost completely eliminated by adjustment while the instrument is in use. However, the sidebands arising from the situation (c) above cannot be eliminated by electromagnetic adjustment. Accordingly, the sole solution to this problem is to fabricate the spectrometer with higher accuracy or use a sample tube that has been produced with higher accuracy.

In general, the inhomogeneous components of a static magnetic field applied to the sample, i.e., the gradient component Bz of the field, can be given using Legendre polynominals as follows:

$$Bz = A_1^0 + A_2^0 z + A_3^0(z^2 - \tfrac{1}{2}(x^2+y^2)) + A_4^0 z(z^2 - (z/3)(x^2+y^2)) + A_2^1 x + B_2^1 y + A_3^1 zx + B_3^1 zy + A_3^2(x^2 - y^2) + B_3^2 xy + \ldots$$

where $A_1^0$, $B_2^1$, and so on are the coefficients of the terms.

Therefore, in an ordinary nuclear magnetic resonance spectrometer, a number of compensating coils, known as shims, which are energized with electric current are placed in the magnetic field to produce compensating gradient magentic fields which serve to cancel out all the terms of the above formula. Rotating the sample about the Z-axis as described above is tantamount to averaging out the horizontal components, i.e., $A_2^1$, $B_2^1$, $A_3^1$, etc., which are not rotationally symmetrical. Unfortunately, rotation of the (solid) sample presents the disadvantage that the shims acting on the horizontal gradient components of the field are made ineffective. In this way, it is impossible to enhance the resolution of spectrum simply by adjusting the X shims and Y shims constituting the shims which act to correct the horizontal gradient components of the field. For example, in the case where rotation of the sample induces apparent horizontal gradient components of the magnetic field when viewed from the sample on account of the inhomogeneity of the sample itself resulting from deposition or other phenomenon or because of the aforementioned situation (c), the effects of the horizontal gradient components of the field cannot be removed by the conventional electromagnetic shim system.

SUMMARY OF THE INVENTION

It is an advantage of the present invention to provide a nuclear magnetic resonance spectrometer which substantially prevents occurrence of spinning sidebands due to asymmetry of the sample tube.

It is another advantage of the invention to provide a nuclear magnetic resonance spctrometer which prevents decrease in the compensating effect of an electromagnetic shim system when the sample or sample tube produces horizontal gradient components of magnetic field.

These advantages are achieved in accordance with the teachings of the invention by a nuclear magnetic resonance spectrometer for irradiating a sample with RF pulses under the condition that a sample tube holding the sample therein is being rotated in a static magnetic field, and for detecting a free induction decay signal resulting from the sample after the irradiation. The spectrometer comprises a means for sensing the angular position of the sample tube; and a means for adding the free induction decay signals. The RF pulses are applied to the sample according to the output signal from the sensing means when a certain location of the sample tube arrives at a first specific position and also when the certain location arrives at a second position diametrically opposite to the first position, whereby two kinds of free induction decay signals are added by the adding means.

It is a further advantage of the invention to provide a nuclear magnetic resonance spectrometer equipped with an electromagnetic shim system to compensate for the inhomogeneity of the static magnetic field employed wherein the spectrometer includes a means for supplying an alternating current in synchronism with the rotation of the sample to the shim system to eliminate the deleterious effects of the horizontal gradient components of the field which are produced by the sample.

DESCRIPTION OF THE PREFERRED EMBODIMENT

Figure 1:
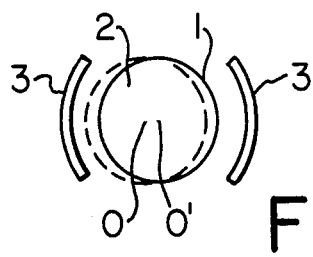
FIG. 1 is a schematic cross section of a sample tube, for illustrating the deviation of the center of rotation of a sample from the center of the tube.

Before the structure of the preferred embodiment is discussed, the theory underlying the inventive concept is described with reference to FIG. 1, which is a schematic view of a sample tube taken in the direction of Z-axis. The sample tube indicated by reference numeral 1 holds a sample 2 therein. A saddle-type receiver coil 3 is disposed near the tube. It is now assumed that the center O' of the sample is shifted from the center of rotation O of the tube 1. A first position of the tube is indicated by the solid line. A second position of the tube when it has made a half revolution from the first position is indicated by the broken line. Comparison of these two positions shows that the distance between the sample and the coil varies as the sample tube turns. As a result, the NMR signal which is derived from the sample 2 and picked up by the coil 3 is subjected to amplitude modulation in synchronism with the rotation. In this case, if the sample exhibits a large permittivity, movement of the sample inside the coil 3 induces changes in the stray capacitance. Since the coil 3 forms part of the tuning circuit of the RF receiver, the tuning frequency is shifted in synchronism with the rotation of the sample. Accordingly, the NMR signal picked up by the receiver coil is subjected to phase modulation in synchronism with the rotation as well as to the foregoing amplitude modulation, resulting in spinning sidebands.

Figure 2A:
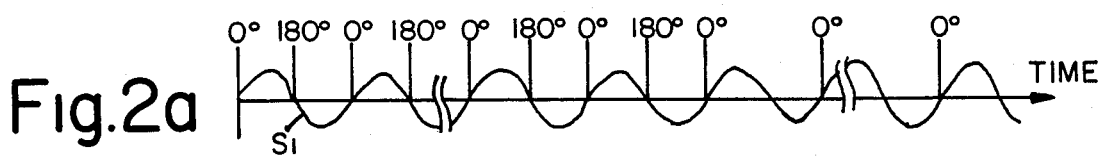
FIGS. 2a–c and 4a–c are waveform diagrams for the understanding of the concept of the present invention.
Figure 2B:
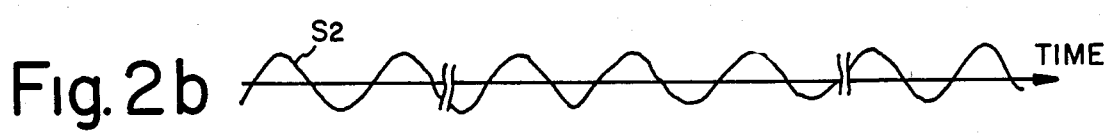
Figure 3A:
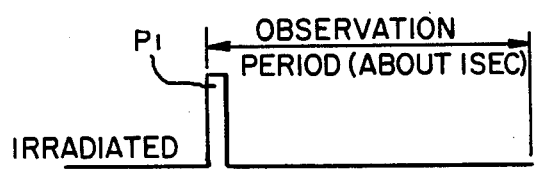
FIGS. 3a, b are waveform diagrams illustrating a sequence of observation.
Figure 3B:
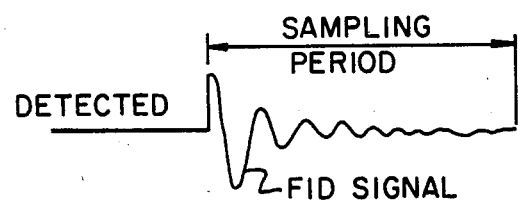

Referring to FIG. 2(a), the rotation of the sample tube is expressed by a sinusoidal wave S1 corresponding to the angular position of a specific location on the tube. For simplicity, it is assumed that the amplitude is modulated with a sinusoidal wave S2 that is synchronized to the wave S1 as shown in FIG. 2(b). Referring to FIG. 3, an RF pulse P1 is applied to the sample, and then the resultant free induction decay (FID) signal is sampled. This sequence of observation is carried out for a period of approximately 1 second, and this process is repeated once.

Figure 2C:
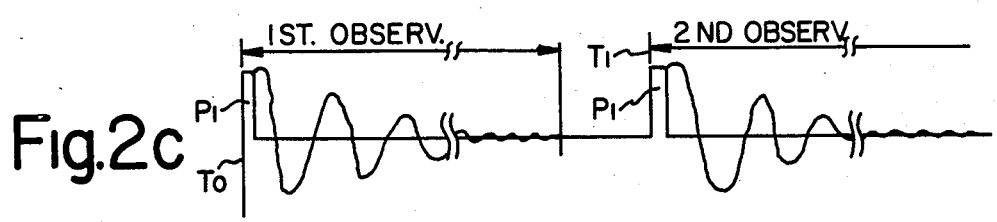

Referring next to FIG. 2(c), the first observation starts with application of one RF pulse P1 at the instant T0 when the sample tube is at angular position 0°. The condition at this instant is shown by the solid line in FIG. 1. The next observation starts with application of the next RF pulse P1 at the instant T1 when the sample tube reaches angular position 180°. The condition at this instant is shown by the broken line in FIG. 1. The free induction decay signals obtained in these observations are next discussed.

Figure 4A:
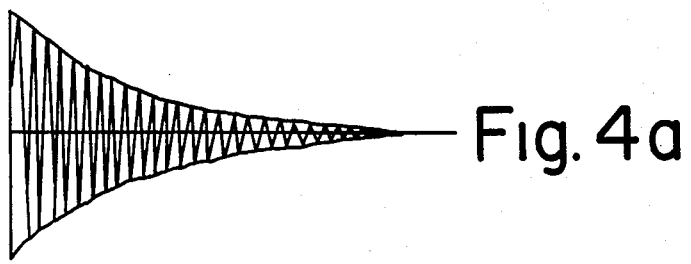
Figure 4B:
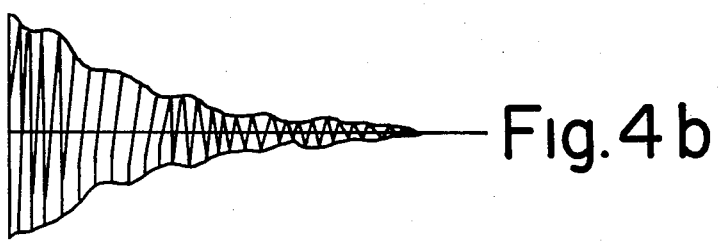
Figure 4C:
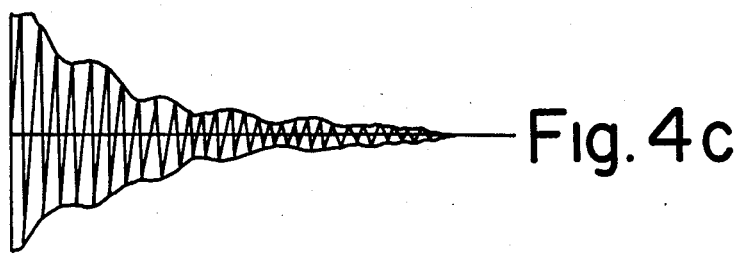

An ideal free induction decay signal which is not subjected to amplitude modulation is shown in FIG. 4(a). The free induction decay signal obtained in the first observation which was initiated at instant T0 is amplitude-modulated with the sinusoidal wave shown in FIG. 2(b), and the waveform shown in FIG. 4(b) is obtained. The free induction decay signal obtained in the second observation that was initiated at instant T1 takes up the waveform as shown in FIG. 4(c). The two observations were commenced under the conditions that the angular positions of the sample tube were in diametrically opposite to each other, i.e., 0° and 180°, and therefore it follows that the two free induction decay signals were amplitude-modulated in 180° out-of-phase relationship. Thus, it is possible to obtain a free induction decay signal which is not modulated as shown in FIG. 4(a) by adding these two signals so that the effects of the two modulations may cancel each other. This method in which observations are initiated when the sample tube is at angular positions 0° and 180° and in which the resultant free induction decay signals are added up permits removal of the spinning sidebands of the first order. In order to remove the spinning sidebands of the second order, two observations which are initiated when the sample tube is at positions 90° and 270°, respectively, may be added, and the resultant four free induction decay signals may be added. Obviously, spinning sidebands of still higher orders can be removed by initiating observations each time the sample tube moves through a further angular distance of 30°, and adding up the resultant free induction decay signals. Although only amplitude-modulation has been discussed thus far for facilitating the understanding, it is obvious that the effects of phase modulation can also be eliminated in exactly the same manner.

Figure 5:
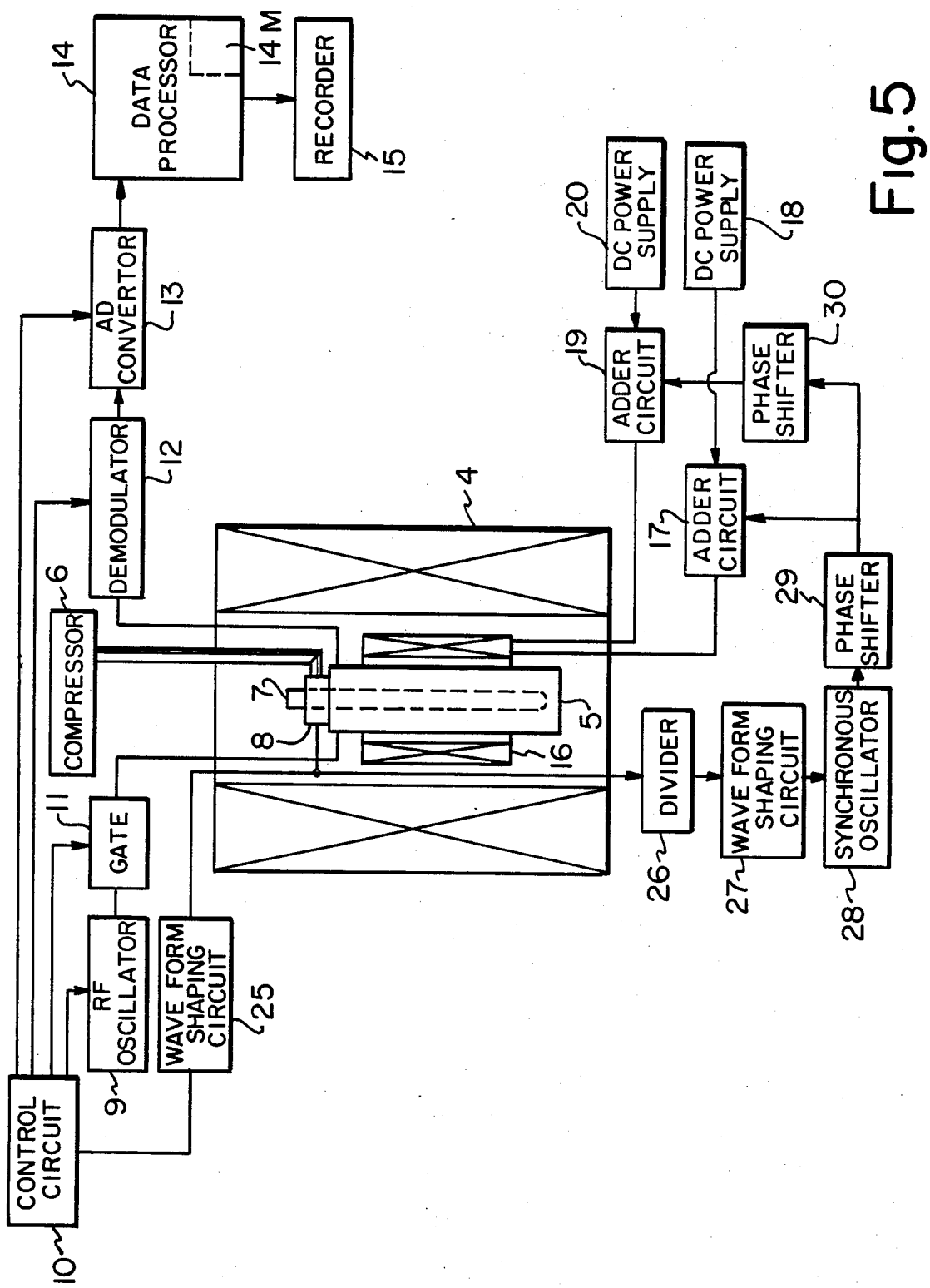
FIG. 5 is a block diagram of a nuclear magnetic resonance spectrometer according to the present invention.

Referring next to FIG. 5, there is shown a nuclear magnetic resonance spectrometer embodying the concept of the invention in block diagram. The spectrometer includes a magnet 4 for producing a dc magnetic field and an NMR probe 5 disposed inside of the magnet 4. Mounted on the probe 5 are a mechanism 8 for rotating a sample tube 7 and an angular position sensing mechanism incorporated in the mechanism 8. Pressurized air from a compressor 6 is directed to the sample tube 7 to rotate the tube. An RF oscillator 9 generates a radio-frequency signal of a frequency identical to the resonance frequency of nuclei to be observed. The RF signal is fed to a gate 11 that is controlled by a control circuit 10 such that the gate 11 supplies RF pulses to the NMR probe. Then, the pulses are applied to the sample via a transmitter coil (not shown). As the sample is irradiated with each RF pulse, the sample produces a free induction decay signal, which is then detected by a receiver coil disposed (not shown) in the NMR probe. The detected signal is fed to a data processor 14 via a demodulator circuit 12 and an analog-to-digital converter 13 both of which are controlled by the control circuit 10. The NMR spectrum which is obtained from the processor by subjecting the signal to a Fourier transform is recorded on a recorder 15. Placed outside the NMR probe lying within the magnet 1 are electromagnetic shims 16, which are coils supplied with electric current and comprise X shims and Y shims. A DC power supply 18 supplies power to the X shims via an adder circuit 17. Simiarly, a DC power supply 20 supplies power to the Y shims via an adder circuit 19.

Figure 7A:
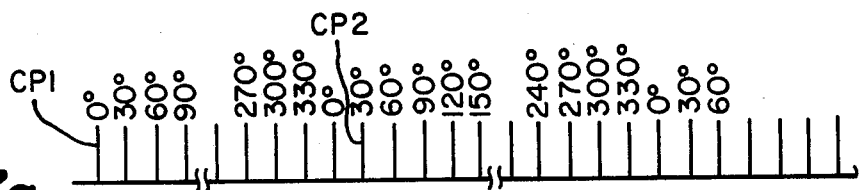
FIGS. 7a, b and 8a, b are waveform diagrams for illustrating the operation of the spectrometer shown in FIG. 5.
Figure 6:
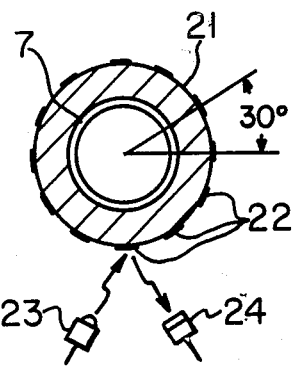
FIG. 6 is a cross-sectional view of the angular position-sensing mechanism of the spectrometer shown in FIG. 5.

Referring next to FIG. 6, there is shown the structure of the aforementioned angular position sensing mechanism incorporated in the sample tube rotating mechanism 8. Mounted on top of the sample tube 7 is a rotor 21 which has twelve tokens 22 equally spaced apart from one another by 30°, for example, circumferentially on its outer periphery. Each of the tokens 22 is made from a material that reflects or absorbs light. A light-emitting device 23 emits a light beam toward the tokens 22. The quantity of light reflected by the rotor changes as the tokens pass across the light spot formed on the rotor, and these changes are sensed by a photodetector 24. Thus, the quantity of light falling on the photodetector 24 undergoes a change every time each token 22 passes across the light spot, the output from the photodetector 24 being shown in FIG. 7(a). That is, each time the sample tube 7 moves through an angular distance of 30°, the photodetector produces one clock pulse. Consequently, the photodetector senses the angular position of the tube 7 in units of 30°.

Figure 7B:
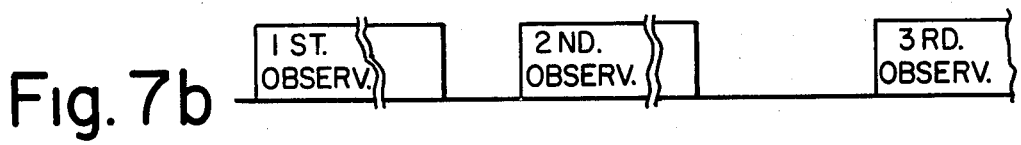

The signal sensed by the photodetector 24 is fed via a waveform-shaping circuit 25 to the control circuit 10, which initiates the first observation by causing RF pulse P1 to be applied to the sample when clock pulse cp1 is generated, i.e., when the angular position is at 0°, as shown in FIG. 7(b). The free induction decay signal F(0°) obtained by this observation is stored in a memory 14M within the data processor 14.

Then, the control circuit 10 initiates the second observation by causing RF pulse P1 to be applied to the sample when clock pulse cp2 is produced, i.e., the angular position is at 30°, as shown in FIG. 7(b). The free induction decay signal F(30°) provided by this second observation is stored in the memory 14M such that it is added to the information corresponding to the signal F(0°). Likewise, the third, fourth and fifth observations are initiated when the angular position is at 60°, 90° and 120°, respectively. Finally, the twelfth observation is initiated when the specific position assumes an angular position of 330°. The free induction signals F(60°), F(90°), F(120°), . . . , F(330°) which are obtained by these observations are added up in the memory 14M. Consequently, the information stored in the memory 14M just when the twelfth observation has been completed is representative of a composite free induction decay signal F(0°)+F(30°)+F(60°)+F(90°)+ . . . +F(300°)+F(330°). As stated above, F(0°) and F(180°) are added so that the undesirable effects of modulations which are in out-of-phase relation may cancel each other. Similarly, F(30°), F(60°), F(90°), F(120°), F(150°) are added to F(210°), F(240°), F(270°), F(300°), F(330°), respectively, for the same purpose. Hence, the resultant composite free induction signal is free of the effects of the modulations up to a high order. Further, the signal-to-noise ratio is improved by the process of accumulation. Then, the composite signal is subjected to Fourier transform to obtain an NMR spectrum from which spinning sidebands have been removed up to a high order. In addition, the spectrum exhibits a high signal-to-noise ratio.

In the embodiment described above, twelve measurements were carried out. If it suffices to simply remove the effects of the first order sidebands, only two measurements may be conducted. Further, in the above embodiment, the angular position at which the sample is irradiated is shifted in an orderly manner from 0° to 30°, and then to 60°, and so on. However, observations can be performed in any arbitrary sequence without altering the result.

Figure 8A:
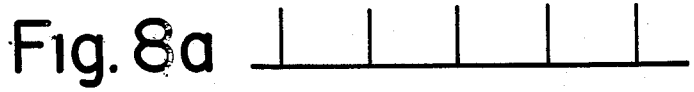
Figure 8B:
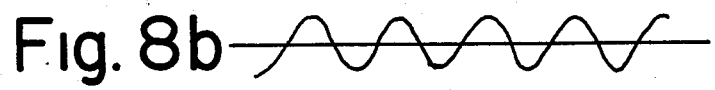

Meanwhile, a portion of the output from the photodetector 24 is applied to a frequency divider 26 which delivers an output signal whose frequency is one-twelfth the input frequency. The output signal from the divider 26 is furnished to a waveform-shaping circuit 27 which produces clock pulses in synchronism with the frequency of the sample tube 5 as shown in FIG. 8(a). A synchronous oscillator 28 generates a sinusoidal wave (FIG. 8(b)) havng the same frequency as the clock pulses in response to these clock pulses fed from the circuit 27. Then, the sinusoidal signal is provided to a phase shifter 29 which delivers two output signals that are 90° out-of-phase. Subsequently, the signals are fed to the X shims and the Y shims, respectively, of the shim system. Each of these two sets of shim coils produces an alternating magnetic field, and the gradient direction of the resultant composite magnetic field rotates about the sample. Since the rotation of the gradient direction is in strict synchronism with the rotation of the sample, the rotating field is stationary relative to the sample. This means that horizontal gradient components of the field which are stationary relative to the sample are produced. The intensity of the gradient components of the field can be controlled by changing the amplitude of the sinusoidal signal produced by the oscillator 28. Also, the direction of the gradient components of the field with respect to the sample can be controlled by varying the phase difference between the rotation of the sample and the sinusoidal signal by the phase shifter 30. Therefore, even if inhomogeneous components of the magnetic field contributing to the inhomogeneity of the sample due to deposition or the like lie in any direction or have any intensity, it is theoretically possible to produce compensating gradient components of the field by means of the shim system for eliminating the effects.

In the instrument shown in FIG. 5, an alternating current synchronized to the rotation of the sample is supplied to the X and Y shims to compensate the first order terms of the horizontal gradient components of the field. In the same way, the second order terms, such as xy and x+y, and higher order terms of the horizontal gradient components of the field can be compensated by supplying sinusoidal signals which are 90° out of phase and, of course, synchronized to the rotation of the sample to a pair of sets of shim coils which produce xy term and (x+y) term, respectively.

Having thus described the invention with the detail and particularity required by the patent laws, what is desired protected under Letters Patent is set forth in the following claims.

I claim:

1. A nuclear magnetic resonance spectrometer having a means for producing a static magnetic field in the direction of Z-axis, a means for rotating a sample tube holding a sample therein in the magnetic field about the Z-axis, and a means for irradiating the sample with radio-frequency pulses and detecting the free induction decay signal emitted from the sample after the irradiation, said nuclear magnetic resonance spectrometer comprising:
 a means for sensing the angular position of the sample tube; and
 a means for adding the free induction decay signals;
 wherein the radio-frequency pulses are applied according to the output signal from the angular position sensing means when a certain location of the sample tube arrives at a first specific position and also when the certain location arrives at a second position diametrically opposite to the first position, whereby two free induction decay signals are added by the adding means.

2. A nuclear magnetic resonance spectrometer as set forth in claim 1, wherein the sensing means senses every 30 degrees of angular movement of the sample tube.

3. A nuclear magnetic resonance spectrometer as set forth in claim 1, wherein the sensing means consists of a light-emitting device, a light-receiving device, and tokens made from a material that absorbs light, the tokens being formed on a rotor which is mounted on the sample tube.

4. A nuclear magnetic resonance spectrometer having a means for rotating a sample tube holding a sample therein in a static magnetic field about Z-axis, an electromagnetic shim system for correcting the homogeneity of the static magnetic field applied to the sample, and a means for irradiating the sample with radio-frequency pulses and detecting the free induction decay signal from the sample after the irradiation, said nuclear magnetic resonance spectrometer comprising:
- a means for sensing the angular position of the sample tube;
- a means for supplying an alternating current synchronized in both frequency and phase with the rotation of the sample to the shim system according to the output from the sensing means; and
- means for adding up the free induction decay signals;

wherein the radio-frequency pulses are applied according to the output signal from the sensing means when a certain location of the sample tube arrives at a first specific position and also when the certain location arrives at a second position diametrically opposite to the first position, whereby two free induction decay signals are added up by the adding means.

5. A nuclear magnetic resonance spectrometer as set forth in claim 4, wherein the shim system consists of a first set of shim coils for correcting the first order terms of the gradient components of the static magnetic field and a second set of shim coils for correcting the second order terms of the gradient components of the field, the first and second sets of shim coils being supplied with an alternating current synchronized to the rotation of the sample tube.

* * * * *

UNITED STATES PATENT AND TRADEMARK OFFICE
CERTIFICATE OF CORRECTION

PATENT NO. : 4,628,263

DATED : December 9, 1986

INVENTOR(S) : Jun Kida

It is certified that error appears in the above-identified patent and that said Letters Patent is hereby corrected as shown below:

Column 1 Line 58 "magentic" should read —magnetic—.

Column 3 Line 63 After "opposite" insert —relation—.

Column 4 Line 49 "Simiarly" should read —Similarly—.

Column 5 Line 60 "havng" should read —having—.

Claim 1 - Column 6 Line 35 "nuclar" should read —nuclear—.

Signed and Sealed this

Fourteenth Day of April, 1987

Attest:

DONALD J. QUIGG

*Attesting Officer*  *Commissioner of Patents and Trademarks*